United States Patent
Yang et al.

(10) Patent No.: US 7,714,368 B2
(45) Date of Patent: May 11, 2010

(54) METHOD AND APPARATUS PROVIDING IMAGER PIXEL ARRAY WITH GRATING STRUCTURE AND IMAGER DEVICE CONTAINING THE SAME

(75) Inventors: Zhaohui Yang, Boise, ID (US); Ulrich C. Boettiger, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 742 days.

(21) Appl. No.: 11/474,437

(22) Filed: Jun. 26, 2006

(65) Prior Publication Data

US 2007/0298533 A1 Dec. 27, 2007

(51) Int. Cl.
*H01L 31/062* (2006.01)
(52) U.S. Cl. ............... 257/291; 257/292; 257/E31.121
(58) Field of Classification Search .................. 438/57; 257/291, 292, E31.121
See application file for complete search history.

(56) References Cited

U.S. PATENT DOCUMENTS

| | | | |
|---|---|---|---|
| 4,708,436 A | 11/1987 | Kleinknecht | |
| 5,306,926 A | 4/1994 | Yonemoto | |
| 5,468,663 A | 11/1995 | Bertin et al. | |
| 5,699,135 A * | 12/1997 | Hisatake et al. | 349/113 |
| 6,995,442 B2 | 2/2006 | Jiang et al. | |
| 2006/0044429 A1 | 3/2006 | Toda et al. | |
| 2007/0045685 A1 * | 3/2007 | Yang et al. | 257/294 |

FOREIGN PATENT DOCUMENTS

| | | |
|---|---|---|
| EP | 1309051 A | 5/2003 |
| WO | WO 94/17493 A | 8/1994 |
| WO | WO 2004/017428 A | 2/2004 |

OTHER PUBLICATIONS

Huber Kostal, et al., "MEMS Meets Nano-optics", Fiber Optic Technology, Nov. 1995.
Cem Ozturk et al.: "Filtering Characteristics of Hybrid Integrated Polymer and Compound Semiconductor Waveguides" Journal of Lightwave Technology, XX, XX, vol. 20, No. 8, Aug. 2002, XP011064489, ISSN: 0733-8724.
Assanto G et al.: "Form Birefringence Phase Matching in Multilayer Semiconductor Waveguides: Tuning and Tolerances" IEEE Journal of Quantum Electronics, IEEE Service Center, Piscataway, NJ, US, vol. 41, No. 10, Oct. 2005, pp. 1293-1302, XP011139202, ISSN: 0018-9197.
International Search Report and Written Opinion of the International Searching Authority dated Nov. 27, 2007.

* cited by examiner

*Primary Examiner*—Trung Dang
(74) *Attorney, Agent, or Firm*—Dickstein Shapiro LLP

(57) ABSTRACT

An imager pixel array capable of separating and detecting the spectral components of an incident light without the use of a color filter array. The imager pixel array employs a grating layer which allows one or more spectral components of incident light to be transmitted therethrough, but diffracts other spectral components of the incident light. Both the transmitted and diffracted spectral components can be sensed by photosensors in the imager pixel array and used in subsequent data processing, thereby improving the quantum efficiency of the imager device. The grating layer can be formed of first and second materials each having a refractive index which are substantially the same at a predetermined wavelength.

57 Claims, 11 Drawing Sheets

METHOD AND APPARATUS PROVIDING IMAGER PIXEL ARRAY WITH GRATING STRUCTURE AND IMAGER DEVICE CONTAINING THE SAME

FIELD OF THE INVENTION

The invention relates generally to semiconductor devices, and in particular to imager pixel arrays and imager devices, and methods of forming the same.

BACKGROUND OF THE INVENTION

Solid state image sensors, also known as imagers, have commonly been used in various photo-imaging applications. An imager absorbs incident radiation of a particular wavelength (such as optical photons or x-rays) and generates an electrical signal corresponding to the absorbed radiation. There are a number of different types of semiconductor-based imagers, including charge coupled devices (CCDs), photodiode arrays, charge injection devices (CIDs), hybrid focal plan arrays, and complementary metal oxide semiconductor (CMOS) imagers. These imagers, when used with appropriate imaging circuits, capture, process and display images for various purposes. Current applications of solid state imagers include cameras, scanners, machine vision systems, vehicle navigation systems, video telephones, computer input devices, surveillance systems, auto focus systems, star trackers, motion detector systems, and image stabilization systems among other uses.

Imagers are typically formed with an array of pixel cells containing photosensors, where each pixel cell produces a signal corresponding to the intensity of light impinging on that element when an image is focused on the array. The signals may then be stored, for example, to display a corresponding image on a monitor or otherwise used to provide information about the optical image. Photosensors are typically photogates, phototransistors, photoconductors or photodiodes. The magnitude of the signal produced by each pixel cell is proportional to the amount of light impinging on the photosensor.

To capture a color image, a color filter array (CFA) is typically employed and placed in front of the array of pixel cells. For example, each pixel cell is covered with a color filter, such as e.g., a red (R), green (G) or blue (B) filter. In a typical CFA layout, the red, green, and blue filters are arranged in a mosaic sequential pattern, such as a Bayer filter pattern, which is quartet-ordered with successive rows that alternate red and green filters, then green and blue filters. When a CFA is used, photosensors separately detect red, green or blue photons.

When using the CFA technique to differentiate colors, the quantum efficiency of an imager can be compromised as color filters allow only a narrow spectral band of incident light (e.g., red, green, or blue light) to pass through while absorbing the rest of the photo energy. Color filter arrays made by current CFA manufacturing processes can also be susceptible to a number of process issues, such as non-planarity and streaks, which can lead to fixed pattern noise and other defects. Moreover, a captured image having individual color pixels must then be processed using a color demosaicing technique, which can increase processing time and the complexity of the imager.

Accordingly, it is advantageous to provide an imager pixel array capable of more efficiently and effectively separating and detecting spectral components of incident light to improve the quantum efficiency of imagers.

BRIEF DESCRIPTION OF THE DRAWINGS

The features and advantages of the invention will be more clearly understood from the following detailed description, which is provided with reference to the accompanying drawings, in which:

FIG. 4b is a lateral cross sectional view of the grating layer shown in FIG. 4a;

FIG. 4c is a longitudinal cross sectional view of the grating layer shown in FIG. 4a;

FIG. 7 shows a block diagram of a typical single chip CMOS imager device comprising the imager pixel array shown in FIG. 1a.

DETAILED DESCRIPTION OF THE INVENTION

Figure 1A:
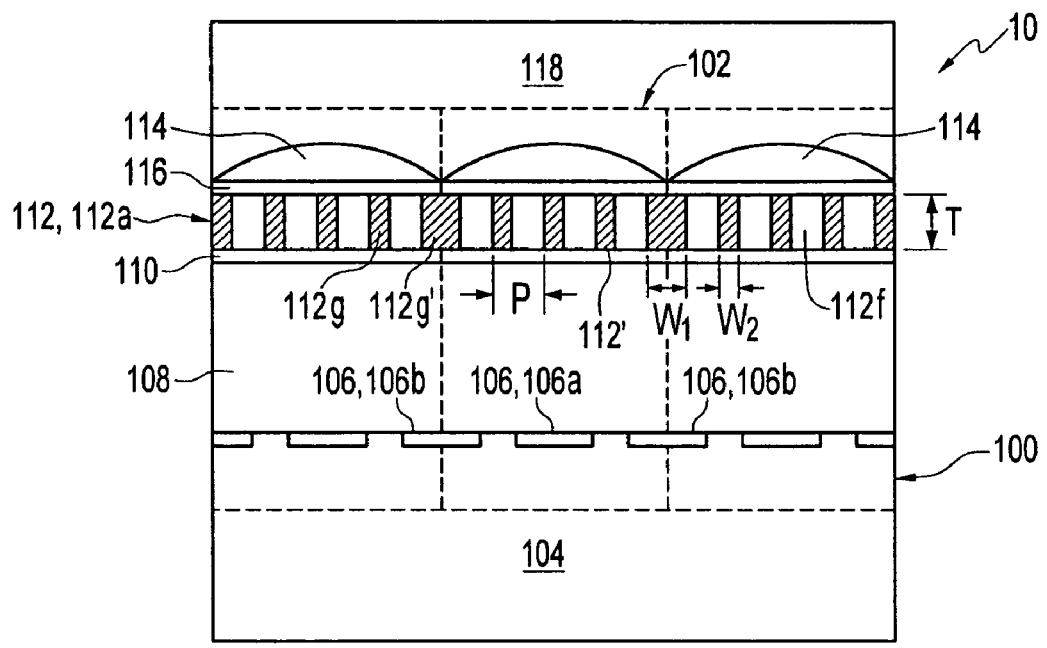
FIGS. 1a and 1b are partial cross sectional views of imager pixel arrays formed according to various embodiments of the invention.

In the following detailed description, reference is made to the accompanying drawings, which form a part hereof and show by way of illustration specific embodiments and examples in which the invention may be practiced. These embodiments and examples are described in sufficient detail to enable those skilled in the art to practice the invention. It is to be understood that other embodiments may be utilized, and that structural, logical, and electrical changes may be made without departing from the spirit and scope of the invention.

The term "substrate" used in the following description may include any supporting structure including, but not limited to, a semiconductor substrate that has a surface on which devices can be fabricated. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures, including those made of semiconductors other than silicon. When reference is made to a semiconductor substrate in the following description, previous process steps may have been utilized to form regions or junctions in or over the base semiconductor or foundation.

The term "pixel" or "pixel cell" as used herein, refers to a photo-element unit cell containing a photosensor for converting photons to an electrical signal as may be employed by an imager device.

Embodiments of the invention relate to an imager pixel array capable of separating and detecting various spectral components of light impinging on the imager pixel array when an image is focused on the array. The imager pixel array can be formed to employ a grating structure to separate the incident light into a plurality of spectral components as the incident light passes through the grating structure. For example, the grating structure can comprise a transmitting grating layer. The separated spectral components can be detected and sensed by different photosensors formed in the imager pixel array to generate image data for subsequent data processing. Because the grating structure allows the various spectral components in the incident light to pass through and to be detected and sensed for subsequent data processing, the quantum efficiency of the imager pixel array can be increased.

According to one aspect of the invention, the grating structure can be formed to comprise different grating and filling materials, which have the same or substantially the same refractive index at a predetermined wavelength. For example, the grating material can comprise a dispersive material, while the filling material can comprise a less dispersive material. The grating structure is capable of separating the incident light into various spectral components of different diffraction orders. For example, one or more spectral components of the incident light can be transmitted through the grating structure without changing the propagation direction and thus, be diffracted into the $0^{th}$ diffraction order. Other spectral components of the incident light can be made to change their propagation directions when such spectral components pass through the grating structure and thus, be diffracted into the $m^{th}$ diffraction order. The spectral components of different diffraction orders can be separately detected and sensed to generate image data for use in subsequent data processing.

According to another aspect of the invention, each pixel cell in the imager pixel array can be formed to comprise a plurality of photosensors for detecting and sensing the different spectral components separated by the grating structure. For example, each pixel cell can be formed to comprise a plurality of photosensors arranged to detect and sense the different spectral components directly transmitted through and diffracted by a section of the grating structure in the pixel cell. As a result, each pixel cell is capable of capturing a plurality of the spectral components of the incident light impinging on that pixel cell and thereby generating image data representing a segment of the image captured by the imager pixel array. For example, each pixel cell can be formed to detect and sense all three primary colors to subsequently generate image data representing the image segment captured by the pixel cell. Accordingly, the imager pixel array may eliminate the need for subsequent color demosaicing to reproduce or display the entire captured image.

According to a further aspect of the invention, a method is provided to capture an image, which can be divided into a plurality of image segments. In one example, incident light from the image is received and separated into a plurality of spectral components. For example, the incident light can be diffracted into spectral components of $0^{th}$ to $m^{th}$ diffraction orders. A substantial portion of one or more of the separated spectral components of the incident light can be detected and sensed, so that the plurality of spectral components have substantially the same photo energy as that of the incident light. The image data can be processed to provide information about the image segment, and to reproduce and/or display the image captured. In one example, all red, green, and blue light of the incident light are separately detected and sensed with or without additional filtering.

In one embodiment, the grating structure can be formed with different grating and filling materials, in which the grating material is a dispersive material. As is used herein, the term "dispersive material" refers to any material whose refractive index changes as the predetermined wavelength of incident light changes. For example, the grating structure can be formed of a pair of dispersive and less dispersive materials having the same or substantially the same refractive index at one or more predetermined wavelengths (e.g., wavelength for red light). The grating structure allows the spectral components (e.g., red light) of such predetermined wavelengths to be directly transmitted through the grating structure without changing their propagation direction and be diffracted into the $0^{th}$ diffraction order. Other spectral components will be diffracted by the grating structure into one or more higher diffraction orders so that the spectral components in the incident light are separated into different groups.

The dispersive and less dispersive material pair can be formed to have the same or substantially the same refractive index at one of any predetermined wavelengths, depending on the spectral component to be detected and sensed (e.g., blue, green, red, or infrared light). For example, the grating structure can be formed with a pair of materials having the same refractive index in the spectrum band of red light or otherwise formed having little effect on red light. When incident light reaches the grating structure, the red light does not "see" or "sees" very little of the grating structure and can thus be transmitted through the grating structure without changing the propagation direction. As a result, the resulting diffraction angle of the red light $\alpha_{red}$ is the same as the incident angle $\beta$.

Because the red light does not "see" the grating structure, the grating structure can be formed to separate the remaining spectral components of the incident light. For example, the grating structure can have different grating height, periods and/or duty cycles. The remaining spectral components (e.g., blue light) will "see" the grating structure and be diffracted from the incident direction. The diffraction angle $\alpha_{blue}$ of the blue light can be calculated by the following equation:

$$d(\sin \alpha_{blue} + \sin \beta) = m\lambda; \alpha_{blue} = a \sin(m\lambda/d - \sin\beta), \quad (1)$$

wherein d is the grating period, $\beta$ is the incident angle, m is the diffraction order, and $\lambda$ is the wavelength. The blue light can thus be separated from the red light. The total color-separation angle $\Delta\theta$ between the red light and blue light (assuming $\lambda_{blue}$=450 nm) can be determined as follows:

$$\Delta\theta = a \sin(m|_{=1}\lambda|_{=0.45}/d|_{=1} - \sin \beta|_{=0}) - \beta|_{=0} = 27°. \quad (2)$$

The imager pixel array can be formed to comprise a plurality of photosensors to detect and sense different groups of spectral components separated by the grating structure. For example, different photosensors can be provided to detect and sense the different spectral components transmitted through and diffracted by the grating structure. In one example, the photosensors can respectively detect and sense all three primary colors of the incident light. For example, a plurality of red photosensors can be provided to detect and sense the directly transmitted red light, while a plurality of green and blue photosensors can be provided adjacent to the red photosensors to detect and sense the diffracted green and blue light. As the incident light is separated into either transmitted or diffracted spectral components, both of which can be detected and sensed for use in subsequent image data processing, the quantum efficiency of the imager pixel array and the imager device can be increased.

In another embodiment, the imager pixel array can be formed so that each pixel can have a plurality of photosensors to detect and sense both the spectral components transmitted through and those diffracted by a section of the grating structure in the pixel cell. For example, red and blue photosensors can be formed in each pixel cell. In one example, a red photosensor can be formed underneath each microlens for detecting and sensing the directly transmitted red light. One or more blue photosensors can be formed in each pixel cell for detecting and sensing the diffracted blue light. For example, the blue photosensors can be positioned adjacent to the red photosensor and in a diffraction direction of the grating structure. In another example, one or more green photosensors can be provided in each pixel cell for detecting and sensing the diffracted green light. Each pixel can detect and sense all three primary colors and is capable of generating image data representing an image segment captured by the pixel. The image data generated by each pixel can be used to reproduce the image without color demosaicing, to thereby simplify the data processing and the imager device or processing system using the imager pixel array.

Various embodiments of the invention will now be described with reference to the drawings, in which like reference numerals represent like elements and redundant description is omitted. Although the embodiments of the invention are described in relation to use with a CMOS imager, as noted, the invention is not so limited and has applicability to any solid state imager.

Figure 1B:
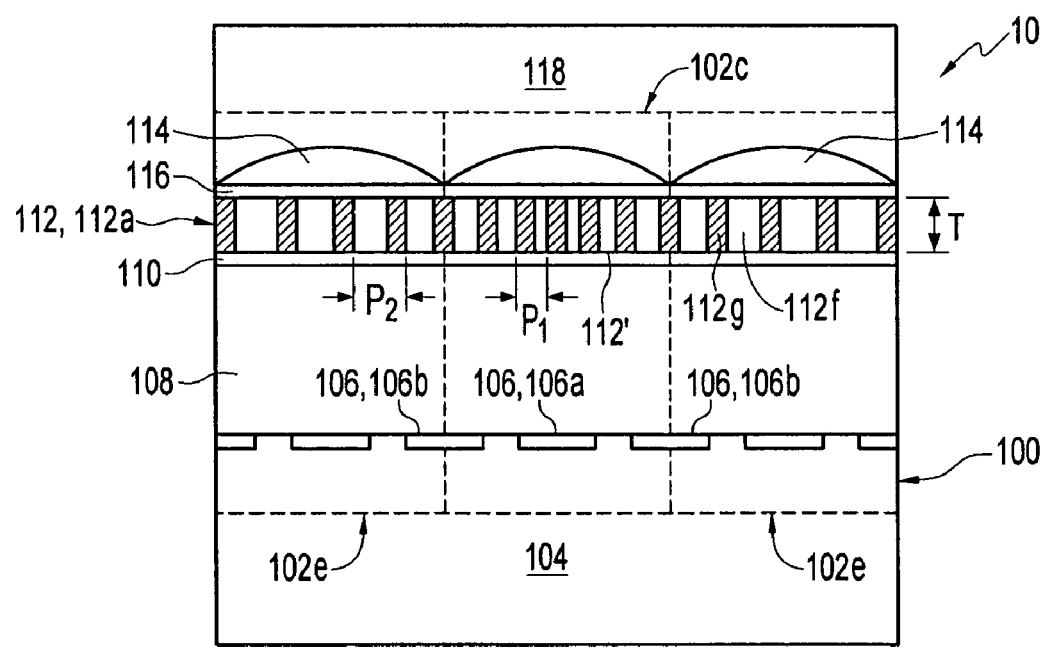

FIGS. 1a and 1b illustrate an imager device 10 comprising an image pixel array 100 formed according to various examples of the invention. The pixel array 100 contains an array of pixel cells 102 formed in association with a substrate 104. Each pixel cell 102 can have a plurality of photosensors 106a and 106b (collectively "photosensors 106") formed on or over the substrate 104. A plurality of conventional layers, such as passivation layers and interlayer dielectric layers 108, with associated metallization patterns 108a (see FIGS. 3a and 3b), can be formed on or over the substrate 104. In the illustrated example, a protective layer 110 is provided over the passivation layers and dielectric layers 108, on which a grating structure 112 can be formed as described below. Each pixel cell 102 has a microlens 114 formed over the grating structure 112 and, if desired, over a spacing layer 116. An additional protective layer 118 can be formed over the microlenses 114. Those skilled in the art will appreciate that the substrate 104, the photosensors 106, the interlayer dielectric layers 108 and associated metallization patterns, the protective layers 110, the microlenses 114, the spacing layer 116, and/or the protective layers 118 can be formed by any of various methods known in the art.

The grating structure 112 can be provided in the imager pixel array 100 to separate incident light into a plurality of spectral components and direct such spectral components to different photosensors 106a and 106b. For example, the grating structure 112 can be formed over at least a portion of the substrate 104 and/or over at least a portion of an array of photosensors 106a, 106b. In one example, the grating structure 112 can be formed throughout the entire imager pixel array 100. In another example, the grating structure 112 can be placed above the photosensors 106a, 106b and spaced therefrom by various distances, such as, for example, about 4 μm.

The grating structure 112 can be in any of various forms. In one example, the grating structure 112 can comprise a grating layer 112a, which can have a thickness T ranging from about 400 nm to about 1.2 μm. For example, when the grating layer 112a is formed with indium-tin-oxide (ITO), the thickness T of the grating layer 112a is about 800 nm. When the grating layer 112a is formed with titanium dioxide ($TiO_2$), the thickness T can be about 600 nm. As is shown in FIGS. 1a and 1b, the grating structure 112 can continuously extend throughout the entire array of the photosensors 106a, 106b. In one example, the grating structure 112 can have the same peripheral as that of the imager pixel array 100. For example, the imager pixel array 100 and the grating structure 112 can have a circular peripheral shape. In another example, the grating structure 112 can comprise a plurality of grating sections 112', each of which is provided within a pixel cell 102. For example, each grating section 112' can have a substantially circular peripheral or otherwise have a shape corresponding to that of a microlens 114 in the pixel cell 102. In the various examples described below, the grating structure 112 is embodied as a continuous grating layer 112a as a representative form. Those skilled in the art will appreciate that the grating structure 112 can be formed in various other forms, which are also within the scope of the invention.

As is shown in the various drawing figures, the grating layer 112a can be formed in any of various manners, such as to provide different diffraction results for various applications. In one example, the grating layer 112a can comprise a plurality of grating portions 112g and a plurality of filling portions 112f alternating with the grating portions 112g. The grating portions 112g and/or the filling portions 112f can be generally formed in elongated shapes (see FIG. 3a). For example, the grating portions 112g and the filling portions 112f can be formed to be parallel to one another. In one example (not shown), the grating portions 112g and the filling portions 112f can be inclined, such as for about 45°, in relation to the imager pixel array 100. In another example (not shown), the grating layer 112a can be formed with circular and concentric the grating portions 112g and the filling portions 112f, such as to provide a uniform response to the incident light.

The grating layer 112a can be formed to have various optical characteristics. For example, the grating layer 112a can have a grating period P (i.e., the distance between two adjacent grating portions 112g) ranging from about 400 nm to about 2 μm. In one example, the grating period P can be greater than the predetermined wavelength of the spectral components. The duty cycle (i.e., the ratio of the grating portion width to the grating period P) can range from about 30% to about 70%. For example, the grating layer 112a has a duty cycle of about 40%. In one example, the grating period P and duty cycle of the grating layer 112a can remain the same or substantially the same across the entire grating layer 112a (see FIG. 3a), resulting in a uniform structure of the grating layer 112a.

Alternatively, the grating period P and/or the duty cycle may vary in various manners as shown in FIGS. 1a through 1f. In one example as shown in FIG. 1a, one or more grating portions 112g' can have a width $W_1$ different from the $W_2$ of other grating portions 112g in the grating layer 112a. For example, one or more grating portions 112g' in each pixel cell 102 can have a larger width than that of the other grating portions 112g (i.e., $W_1 > W_2$) in the same pixel cell 102. Such a wider grating portion 112g' can be placed between and shared by two adjacent pixel cells 102 as shown in FIG. 1a. In one example, the grating layer 112a has a grating period P of 800 nm and duty cycle of 40%. When the microlens 114 is formed to have a lens pitch of 3.5 μm, the grating portions 112g' located between pixel cells 102 can have a width $W_1$ of about 620 nm while the other grating portions 112g have a width $W_2$ of about 480 nm. In another example, one or more filling portions 112f can have a width different from the width of other filling portions 112f in the grating layer 112a. In a further example, the grating portions 112g and/or the filling portions 112f can vary across the entire grating layer 112a and/or within pixel cells 102.

FIG. 1b shows another example in which the grating period P of the grating layer 112a can vary across the entire grating layer 112a in the grating direction. For example, the pixel cell 102c located near a center portion of the grating layer 112a has a grating period $P_1$ smaller than the grating period $P_2$ of other pixel cells 102e located away from the center portion (i.e., $P_1<P_2$). In one example, the varying grating period P is capable of compensating for the direction change in incident light, which can be caused by a curved camera lens surface. For example, the grating period P can gradually increase from the center portion toward the peripheral portions of the grating layer 112a along its grating direction.

Additionally and alternatively, the microlenses 114 can be altered to assist in directing diffracted spectral components into the respective photosensors 106a and 106b. In one example, the microlenses 114 can be moved away from the center portion of the grating layer 112a along the grating direction in response to the changes of both incident light direction and grating period P as discussed above. In another example, the microlenses 114 can be moved away from the center portion of the grating layer 112a in a direction perpendicular to the grating direction in response to the direction change of incident light.

Figure 1C:
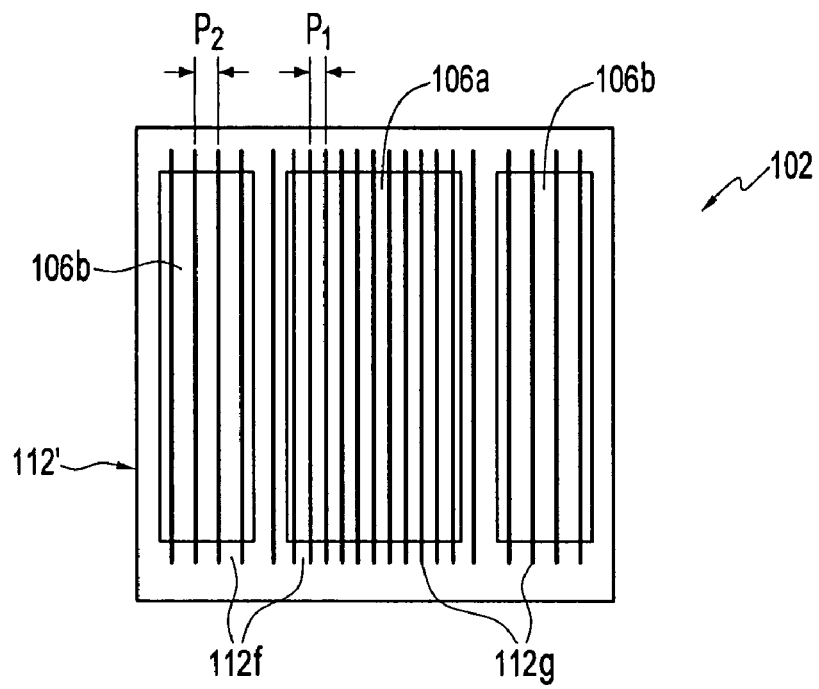
FIGS. 1c and 1d are top views showing different examples of a partial grating structure in a pixel cell.
Figure 1D:
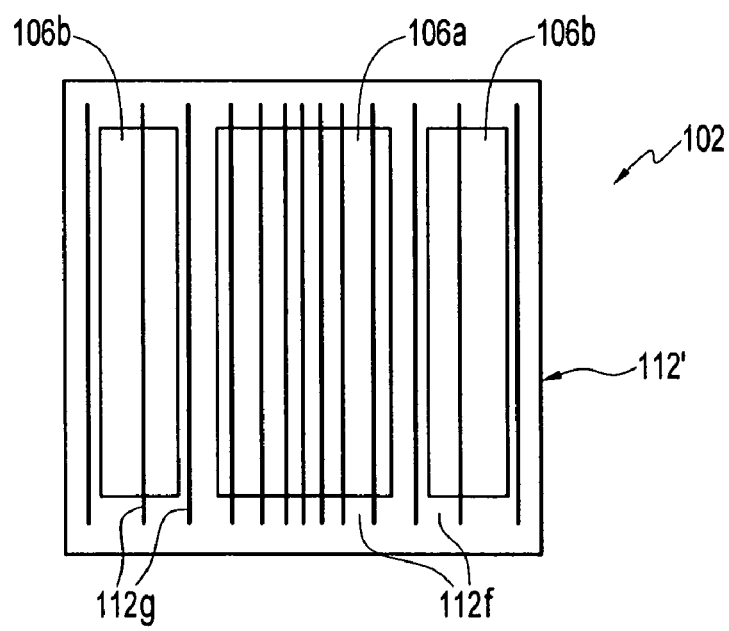

FIGS. 1c and 1d show in top down view that the grating period P can vary within a pixel cell 102. In one example as shown in FIG. 1c, the grating section 112' has a smaller grating period $P_1$ above the first photosensor 106a and a larger grating period $P_2$ above the second photosensor 106b (i.e., grating period $P_1<P_2$). In another example as shown in FIG. 1d, the grating period P can vary across the pixel cell 102 along the grating direction. For example, the grating period P of each grating section 112' can have a grating period increasing from a center portion toward the peripheral portions of the grating section 112'. In an example, the grating period increases gradually within each pixel cell 102.

Additionally or alternatively, the duty cycle of the grating layer 112a can vary. For example, the duty cycle can vary across the entire grating layer 112a in the pixel array 100 and/or within each pixel cell 102 along the grating direction. In one example as shown in FIG. 1b, the duty cycle of the grating layer 112a provided across the pixel array 100 decreases from the center portion to peripheral portions of the grating layer 112a. In another example as shown in FIG. 1d, the duty cycle decreases from the center portion to the peripheral portions of the grating section 112' in each pixel cell 102. The duty cycle can decrease gradually along the grating direction.

Figure 1E:
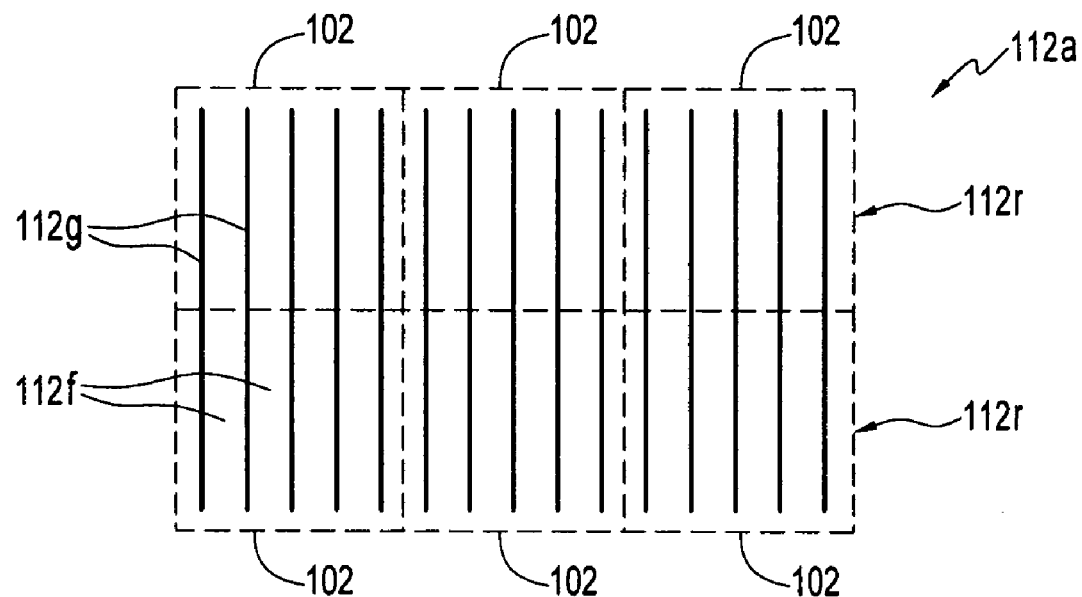
FIGS. 1e and 1f are top views showing additional examples of a partial grating structure.
Figure 1F:
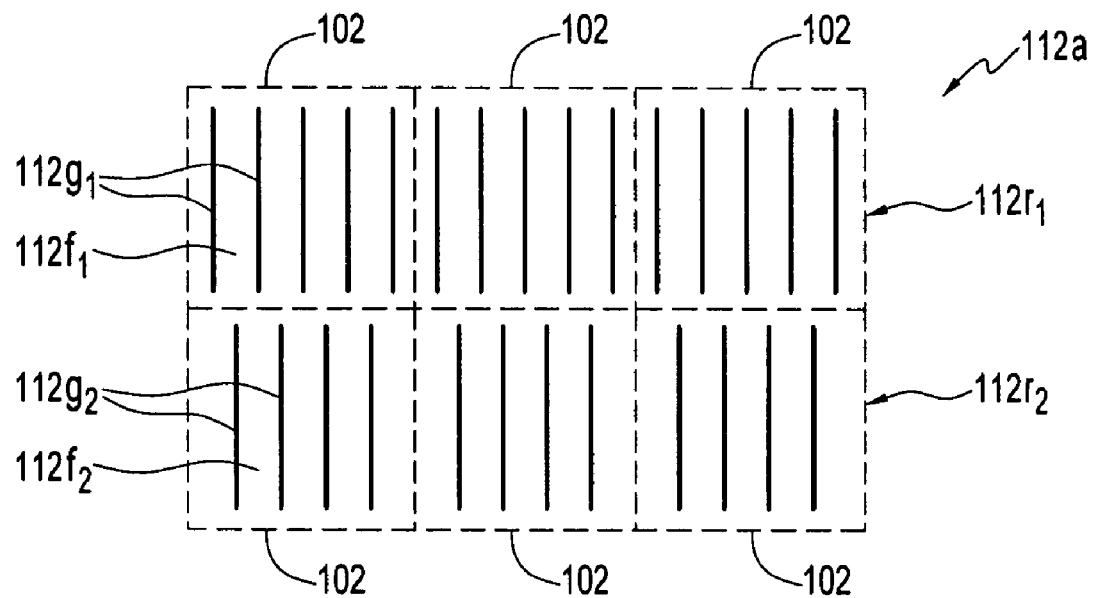

FIGS. 1e and 1f show that the grating layer 112a can be formed so that one grating row 112r can be formed to be the same as or different from another grating row 112r. In one example as shown in FIG. 1e, the grating portions 112g and the filling portions 112f in the grating layer 112a can continuously extend across all the grating rows 112r and throughout the entire grating layer 112a. The various grating rows 112r in the resulting grating layer 112a can be the same as one another. In another example as shown in FIG. 1f, the grating portions $112g_1$ (or the filling portions $112f_1$) in a grating row $112r_1$ can be at least partially staggered with at least some of the grating portions $112g_2$ (or the filling portions $112f_2$) in another grating row $112r_2$. The grating row $112r_1$ formed in this example differs from the grating row $112r_2$. Although grating rows $112r_1$ and $112r_2$ are shown to be adjacent to each other, they can be spaced apart by one or more additional grating rows 112r. Those skilled in the art will appreciate that the grating layer 112a can be formed in various other manners, which are also within the scope of the invention.

The grating layer 112a can be formed of any of various materials. For example, the grating layer 112a can be formed of first and second different materials having substantially the same refractive index at one or more predetermined wavelengths. In one example, the first and second materials can each have a refractive index of about 2 at a predetermined wavelength in the visible light range, such as red, green, or blue light.

In one example, the plurality of grating portions 112g and the plurality of filling portions 112f of the grating layer 112a can be formed to respectively comprise a grating material and a filling material. The grating material can comprise a dispersive material, such as any one of the following compounds: ITO, $TiO_2$, gallium nitride (GaN), zinc oxide (ZnO), gallium arsenide (GaAs), gallium phosphide (GaP), indium phosphide (InP), gallium-arsenide-phosphide ($GaAs_xP_y$), silicon (Si), and a silicon-rich dielectric (e.g., silicon rich oxide) material. For example, GaAs can be used as a grating material to form grating layer 112a for separating one or more spectral components in the infrared range from visible light or from other spectral components in the infrared range. Additionally or alternatively, the filling material can comprise a material that is less dispersive than the grating material. In one example, the less dispersive material can have a refractive index that is unchanged or substantially unchanged. For example, the filling material can comprise any of silicon nitride ($Si_3N_4$), silicon-nitride-oxide ($SiN_xO_y$), tin dioxide ($SnO_2$), silicon carbide (SiC), tantalum pentoxide ($Ta_2O_5$), and InP. Those skilled in the art will appreciate that the grating and filling materials can be any of various other materials, which are also within the scope of the invention.

In another example, the grating layer 112a can be formed with a pair of dispersive and less dispersive materials. The dispersive and less dispersive material pair can be selected from the group consisting of ITO and $Si_3N_4$, ITO and $SiN_xO_y$, ITO and $SnO_2$, $TiO_2$ and SiC, $TiO_2$ and $Ta_2O_5$, GaN and SiC, GaN and $Ta_2O_5$, ZnO and $Si_3N_4$, ZnO and $SiN_xO_y$, and ZnO and $SnO_2$, $GaAs_xP_y$ and InP, and a silicon-rich dielectric material and $SiN_xO_y$. In one example, any one the following material pairs can be used to form a grating layer 112a for operations in the visible light range, such as for separating red light from blue light: ITO and $Si_3N_4$, ITO and $SiN_xO_y$, ITO and $SnO_2$, $TiO_2$ and SiC, $TiO_2$ and $Ta_2O_5$, GaN and SiC, GaN and $Ta_2O_5$, ZnO and $Si_3N_4$, ZnO and $SiN_xO_y$, and ZnO and $SnO_2$. For example, the resulting grating layer 112a can be used to separate red light and blue light.

In a further example, one or more material pairs can be used to form grating layers 112a for separating infrared light from visible light or separating an infrared spectral component from another infrared spectral component. Such grating layers 112a can be used in night vision devices. In one example, the grating layer 112a can be formed of ITO and $SiN_xO_y$ to separate infrared light from visible light. In another example, a grating layer 112a formed of a material pair of $GaAs_xP_y$ and InP or of a silicon-rich dielectric material and $SiN_xO_y$ is capable of separating one infrared spectral component from another spectral component. Those skilled in the art will appreciate that the dispersive and less dispersive materials can be any of various other material pairs, which are also within the scope of the invention.

Figure 2A:
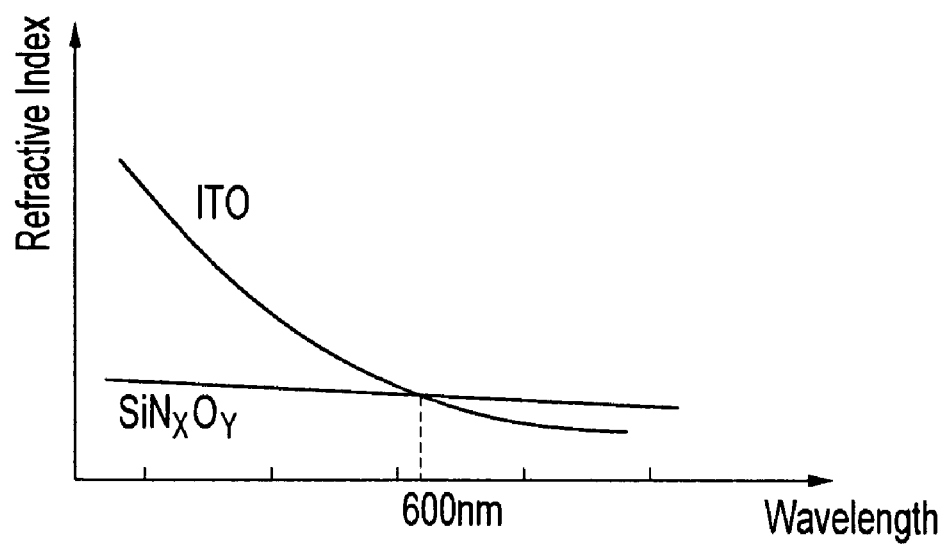
FIGS. 2a and 2b show diffractive index charts of dispersive and less dispersive material pairs.
Figure 2B:
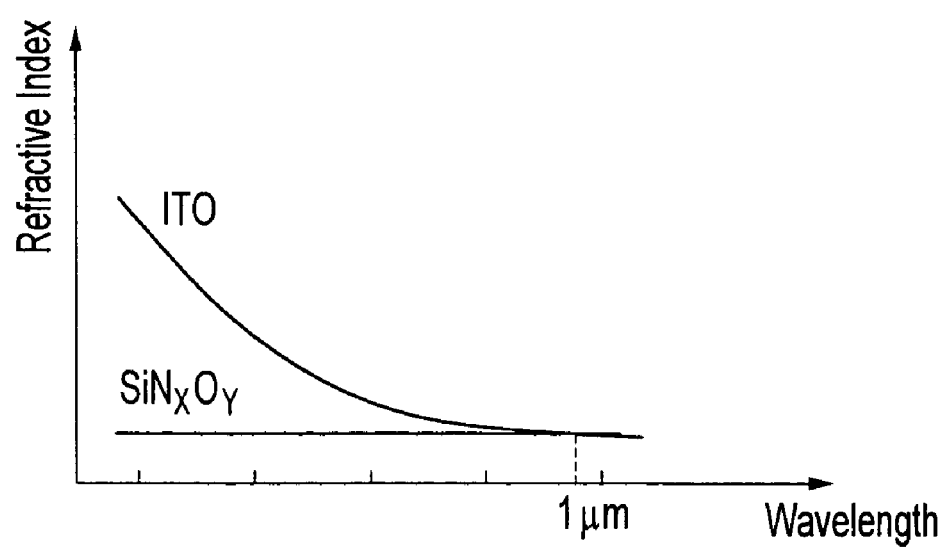

FIGS. 2a and 2b show examples of the results of using dispersive and less dispersive materials to form a grating layer for different applications. In one example shown in FIG. 2a, the first and second materials are respectively ITO and $SiN_xO_y$, which have the same refractive index (e.g., about 2) in the spectrum band of red light (e.g., about 600 nm). Using these materials, the formed grating layer 112a allows red light to be directly transmitted while diffracting blue light. In another example shown in FIG. 2b, the material pair of ITO and $SiN_xO_y$ is formed to have the same refractive index in spectrum band of infrared light. The resulting grating layer 112a allows infrared light to be directly transmitted therethrough and diffracts visible light.

As is shown in the various drawing figures, the spectral components transmitted through and diffracted by the grating layer 112a can be detected and sensed by any of various photosensors 106a, 106b. For example, at least one of the first and second photosensors 106a and 106b can be formed to detect and sense visible light, such as blue, green, or red light. In one example, when the grating layer 112a is formed with ITO and $Si_3N_4$ to allow red light to transmit therethrough, the first photosensors 106a are provided to detect and sense red light which is transmitted through the grating, while the second photosensors 106b are provided to detect and sense blue light which is diffracted to adjacent photosensors 106b. Thus, in one example, red and blue photosensors 106a and 106b are provided to detect and sense red and blue light, respectively.

In another example, one or more of the photosensors 106a, 106b can be configured to detect and sense infrared light and/or an infrared spectral component separated by the grating layer 112a. For example, first and second photosensors 106a and 106b can be formed to respectively receive transmitted infrared light and diffracted visible light, which are separated by the grating layer 112a. In another example, first and second photosensors 106a and 106b can be formed to detect and sense different spectral components in the infrared range.

Figure 3A:
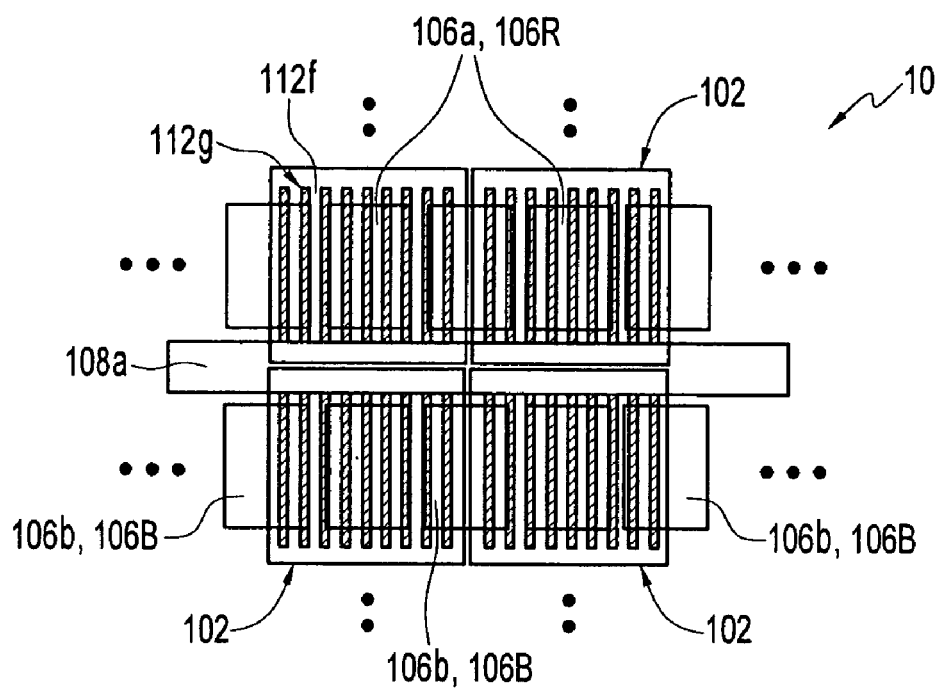
FIGS. 3a and 3b are top views of imager pixel arrays formed in accordance with various embodiments of the invention.
Figure 3B:
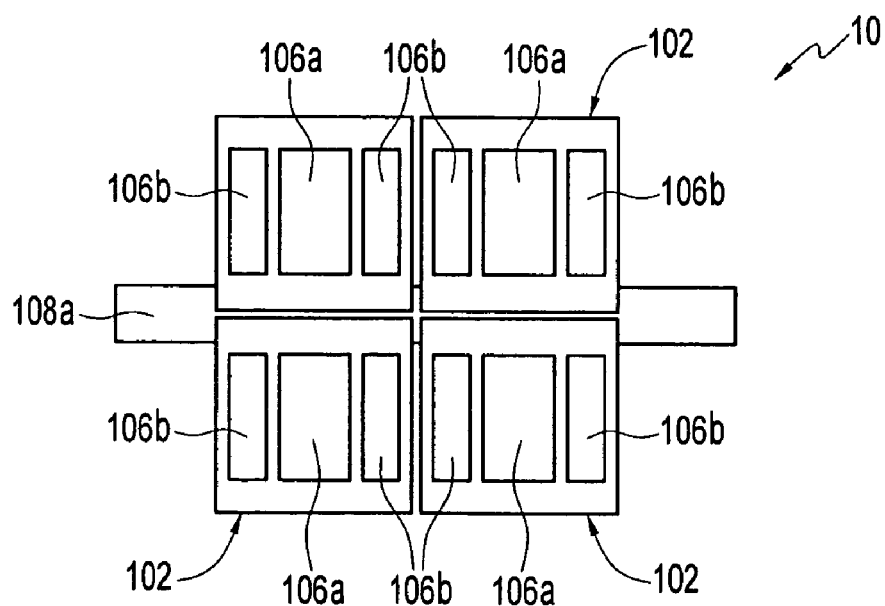

As FIGS. 3a and 3b show, the photosensors 106a, 106b can be arranged in any of various manners to detect and sense the various spectral components transmitted through and/or diffracted by the grating layer 112a. For example, one or more photosensors 106a, 106b can be provided entirely or partially in each pixel cell 102 to receive one or more spectral components separated by the grating layer 112a. In the various examples as shown in FIGS. 3a and 3b, at least one first photosensor 106a can be provided in each pixel 102 (also see FIGS. 1a through 1d). The first photosensors 106a can be formed in a direct light path beneath a microlens 114 for receiving a spectral component transmitted into the $0^{th}$ diffraction order. In one example, a red photosensor 106R is placed directly beneath a microlens 114 to receive red light directly transmitted through the grating layer 112a.

FIGS. 3a and 3b also show that a plurality of second photosensors 106b can be arranged in any of various manners to receive one or more spectral components diffracted by the grating layer 112a. In one example, one or more second photosensors 106b can be provided in each pixel 102 (also see FIGS. 1a through 1d) to receive one or more diffracted spectral components. For example, at least one second photosensor 106b can be formed on each side of a first photosensor 106a along the diffraction direction of the grating layer 112a. The second photosensors 106b can alternate with the first photosensors 106a in each pixel row. In one example shown in FIG. 3a, which shows the grating structure 112 in place, each second photosensor 106b is formed to bridge and be shared by two adjacent pixels 102. FIG. 3b shows another example of the pixel arrangement without the grating layer 112a in place, but which can have the same grating layer 112a as FIG. 3a. As FIG. 3b shows, a pair of second photosensors 106b are formed on both sides of a first photosensor 106a to receive blue light diffracted away from the red light. The second photosensors 106b in each pixel 102 are disconnected from the second photosensors 106b in the adjacent pixels 102.

The photosensors 106a, 106b can be formed in any of various sizes. In one example, as shown in FIG. 3a, the photosensors 106a, 106b can have a pitch of about half of that of the microlenses 114. For example, the pitch of the photosensors 106a, 106b can range from about 1 μm to about 5 μm, while the microlenses 114 can each have a pitch ranging from about 2 μm to about 10 μm. In another example, as shown in FIG. 3b, the second photosensors 106b can have a pitch of about one fourth of that of the microlenses 114.

In a desired example, each pixel cell 102 of the imager pixel array 100 can be formed to provide image data representing an image segment captured by such pixel cell 102. As is shown in FIG. 3a, each pixel cell 102 can be formed to comprise a first photosensor 106a and a second photosensor 106b for detecting and sensing different spectral components transmitted through and diffracted by a grating section 112' within such a pixel cell 102. For example, a red photosensor 106R and at least one blue photosensor 106B are provided in each pixel 102 for detecting and sensing the transmitted red light and diffracted blue light. The second photosensor 106b in each pixel cell 102 can be integrally formed with another second photo sensor 106b from an adjacent pixel cell 102. Additional photosensors, such as green photosensors (not shown), can also be provided to detect the diffracted green light.

The red, blue, and green photosensors 106R and 106B (green photosensors not shown) in each pixel cell 102 can thus detect and sense all three primary colors of the incident light impinging on the pixel cell 102 to generate image data representing an image segment captured by the pixel cell 102. As a result, color demosaicing is not needed when reproducing or displaying the image focused on the image pixel array 100. Those skilled in the art will appreciate that the photosensors 106a, 106b can be formed in various other ways, which are also within the scope of the invention.

One example of a single-pixel two-color-detection imager pixel design is schematically shown in FIG. 1a. In this particular example, each pixel cell 102 has a red photosensor 106R centrally located in the pixel cell 102 and directly beneath the microlens 114. A blue photosensor 106B is formed on each side of the red photosensor 106R and is shared by an adjacent pixel cell 102. The microlens 114 has a pitch of 3.5 μm. The photosensors 106R, 106 each have a pitch of 1.75 μm. The stack height (i.e., the distance between the microlenses 114 and the photosensors 106R, 106B) of the pixel cell 102 is 4 μm.

The grating layer 112a is provided beneath the microlens 114. The grating layer 112a comprises a dispersive material ITO and a less dispersive material $SiN_xO_y$, which is formed as a surrounding medium. Both ITO and $SiN_xO_y$ have an refractive index of about 2 at the wavelength of about 600 nm. The grating layer 112a has a grating period P of 800 nm for blue-red light separation and a duty cycle of 40%. The thickness of the grating layer 112a is 800 nm.

When the pixel cell 102 is in operation, incident light impinging on the microlens 114 transmits therethrough and then passes through the grating section 112' located beneath the microlens 114. The grating section 112' allows the red light of the incident light to be transmitted directly through and directs the transmitted red light to the photosensor 106a, 106R. The blue spectral component is diffracted by the grating section 112' and directed to the two adjacent blue photosensors 106b, 106B in the same pixel cell 102. Each pixel cell 102 can perform red-blue light separation and detection without using a color filter array. Additionally or alternatively, the pixel cell 102 is capable of providing image data to be used to reproduce the captured image without color demosaicing. Those skilled in the art will appreciate that the pixel cell 102 can be formed and operate in various other ways, which are also within the scope of the invention.

Figure 4A:
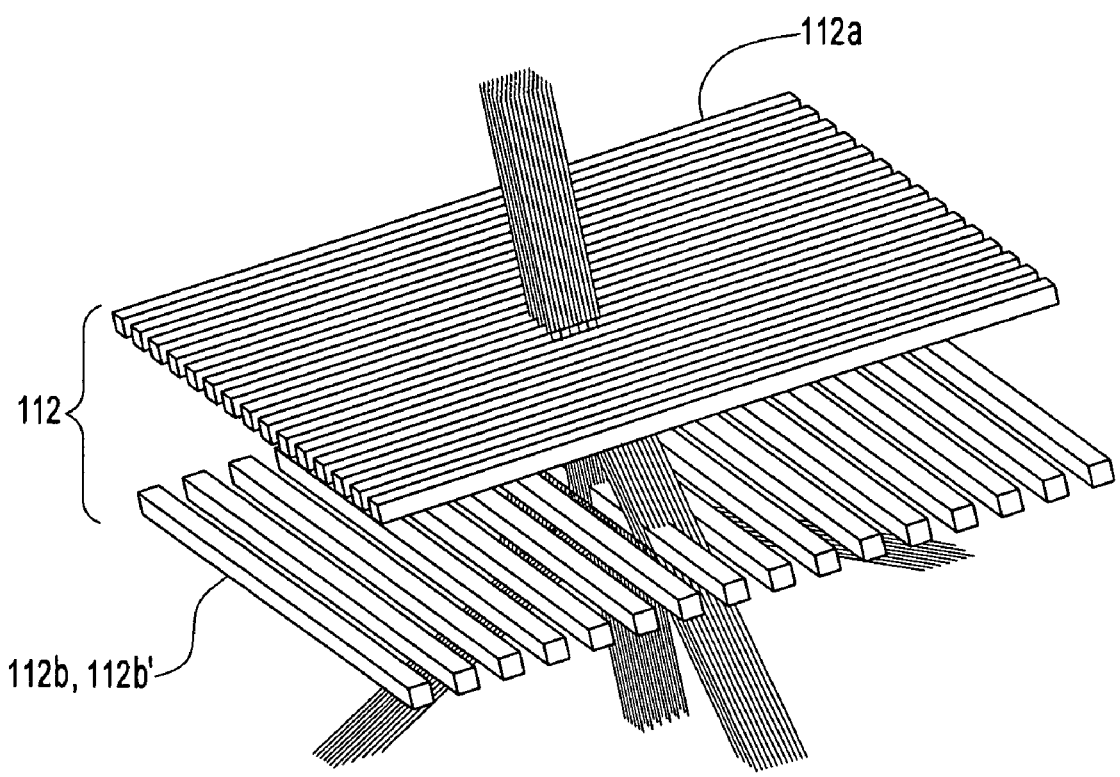
FIG. 4a is a perspective view of a grating layer formed in accordance with another embodiment of the invention.
Figure 4B:
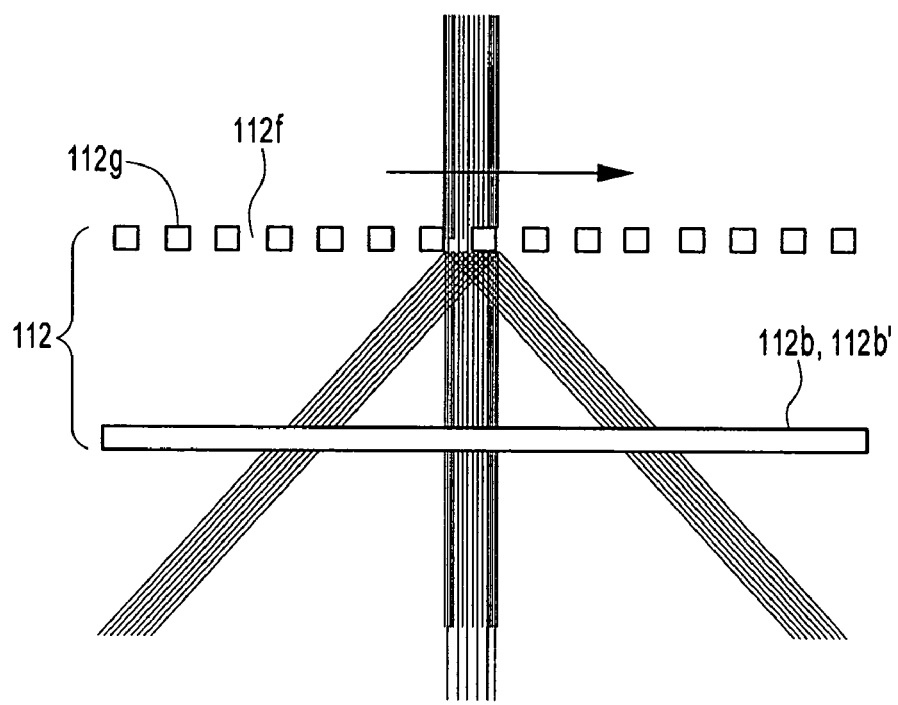
Figure 4C:
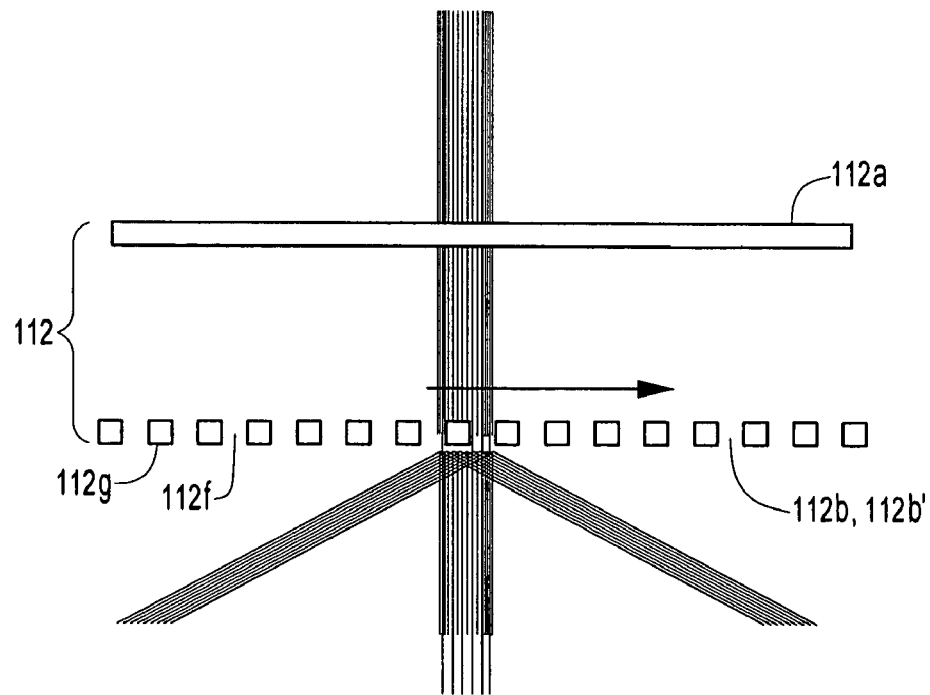

FIGS. 4a to 4c show another example of grating structure 112 which comprises one or more cascaded grating layers 112b, which can be formed according to various examples discussed above. For example, one cascaded grating layer 112b is provided and formed beneath the grating layer 112a. Each cascaded grating layer 112b can be provided to further separate the spectral components into sub-spectral components to be detected and sensed by the array of photosensors 106a and 106b.

In one example, the cascaded grating layer 112b can be in the form of a sub-wavelength grating for diffracting incident light into multiple diffraction orders. For example, the sub-wavelength grating 112b' can be formed to have a grating period longer than the predetermined wavelength of some spectral components (e.g., blue light), but shorter than other spectral components (e.g., green and red light). The sub-wavelength grating 112b' can further separate the green and blue lights by diffracting the green light into the $0^{th}$ diffraction order and the blue light into a higher diffraction order. The diffracted green and blue lights can be separately detected and sensed by green and blue photosensors provided in the image pixel array 100. For example, the green photosensors (not shown) can be positioned adjacent to the blue photosensors 106B along the diffraction direction of the sub-wavelength grating 112b'. Details of the formation and function of sub-wavelength gratings 112b' may be found, for example, in U.S. patent application Ser. No. 11/209,774 filed Aug. 24, 2005 by the same inventors herein, which is incorporated herein by reference.

As is shown in FIGS. 4a to 4c, the grating directions of the grating layer 112a and the cascade grating layer 112b can each have a diffraction direction. In one example, the cascade grating layer 112b can have a different diffraction direction from that of grating layer 112a. This allows the grating layer 112a and the cascaded grating layer 112b to diffract spectral components in different directions. For example, the diffraction directions of the grating layer 112a and the cascade grating layer 112b are perpendicular with each other, as shown by the arrows in FIGS. 4b and 4c. In one example, a plurality of cascaded grating layers 112b can be provided. Each of the cascaded grating layers 112b can be formed to have a diffraction direction different from those of the grating layer 112a and other cascaded grating layer(s) 112b. Those skilled in the art will appreciate that the grating layer 112a and the one or more cascade grating layers 112b can be oriented in various other ways, which are also within the scope of the invention.

Although FIGS. 4a to 4c show the grating layer 112a and the cascaded grating layer 112b as being spaced apart from each other, the spacing between the grating layer 112a and the cascaded grating layer 1112b is exaggerated for illustration purposes. For example, the two grating layers 112a and 112b may be formed to be in contact with each other. Those skilled in the art will appreciate that the cascaded grating layer 112b can be formed in various other ways, which are also within the scope of the invention.

Figure 5A:
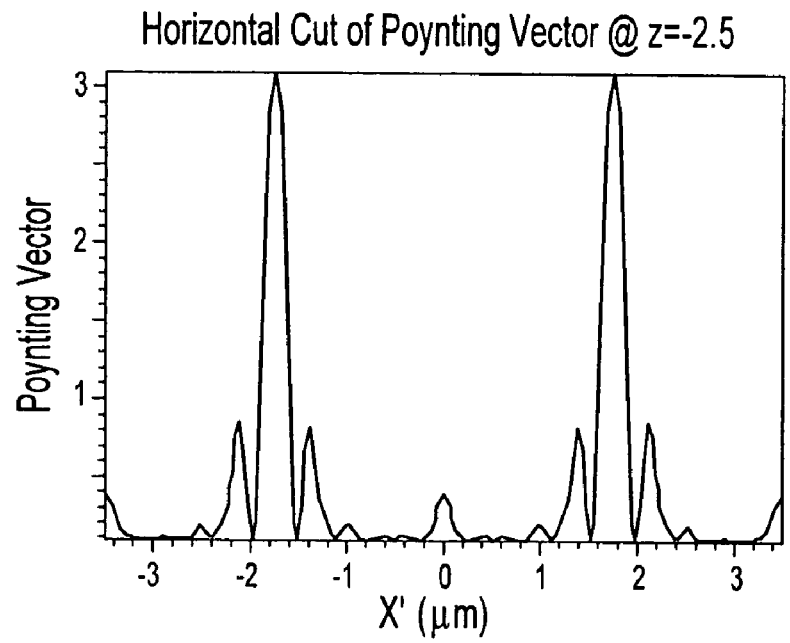
FIGS. 5a and 5b show photo energy distributions at different wavelengths.
Figure 5B:
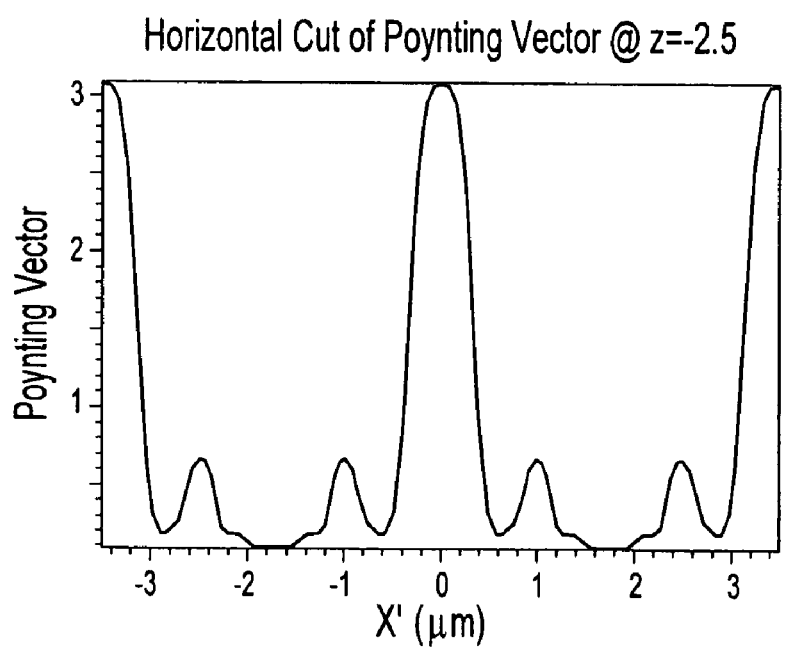

FIGS. 5a and 5b illustrate the performance of the imager pixel cells 102 of the invention by showing photo energy distributions at λ=450 nm (i.e., spectrum center of blue light) and at λ=630 nm (i.e., the spectrum center of the red light), respectively. The pixel performance was analyzed using an electromagnetic simulation tool. The Maxwell's equations are numerically solved using the finite-difference-time-domain method, presenting the optical properties of the imager pixels 102. As is shown FIG. 5a, the grating layer 112a diffracts the blue energy, which can be detected and sensed by the blue photosensors 106B. FIG. 5b shows that the grating layer 112a transmits the red energy, which can be detected and sensed by the red photosensor 106R placed directly underneath each microlens 114 as shown in FIG. 1a or 1b. Accordingly, a substantial portion of each of the separated spectral components (i.e., red and blue light) can be detected and sensed, such as through the photosensors 106R, 106B.

Figure 6:
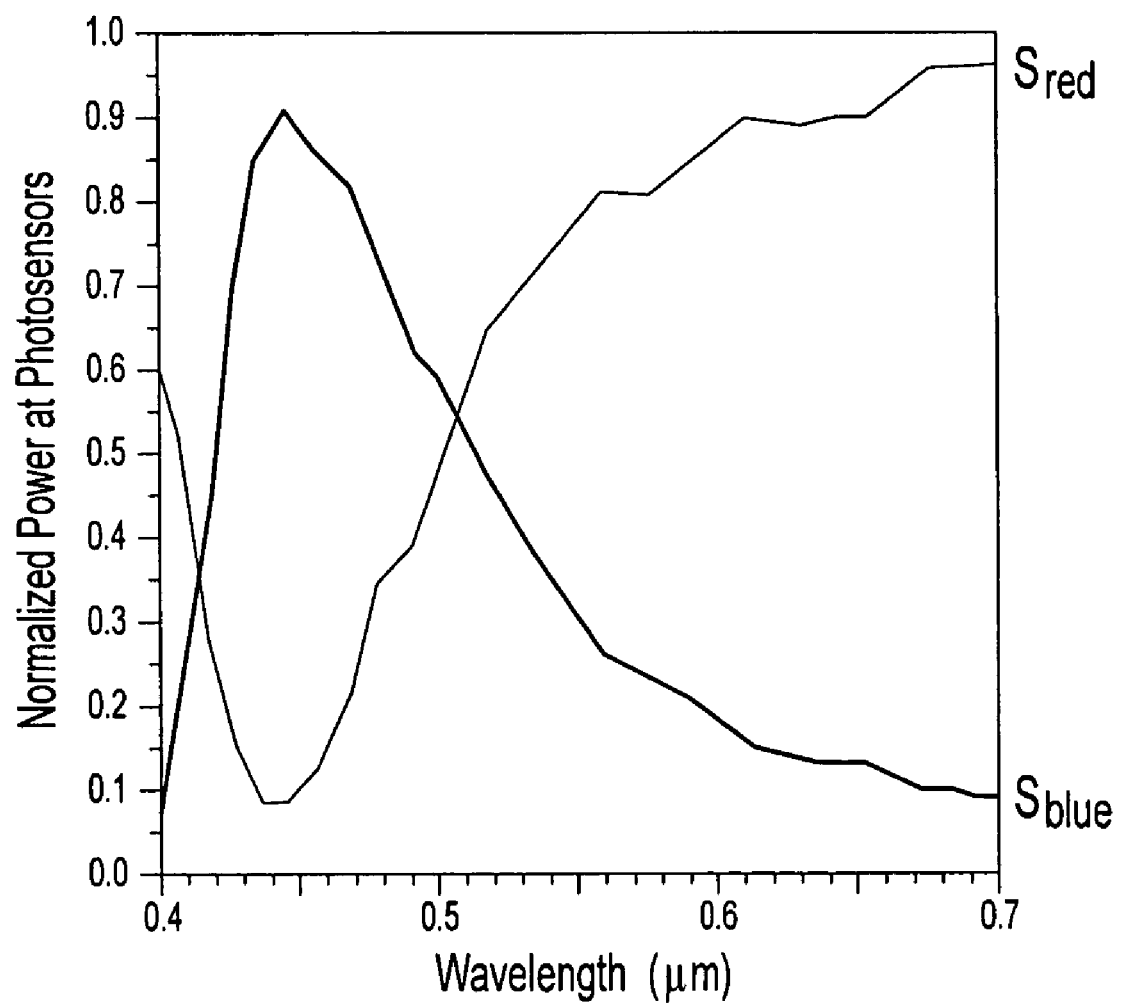
FIG. 6 shows the efficiencies of red and blue photosensors in an imager formed in accordance with various embodiments of the invention.

FIG. 6 shows the efficiencies of the red and blue photosensors 106R and 106B when collecting the separated spectral components of the incident light impinging on the microlenses 114. A substantial portion of the red light signal $S_{red}$ can be received by the red photosensors 106R while most of the blue light signal $S_{blue}$ can be received by the blue photosensors 106B. In one example, one part of the green spectral energy is received by the red photosensor 106R and another part of the green energy is received by blue photosensors 106B. One or more additional grating layers 112a, 112b can be used to further separate the green light from the red and blue light.

Accordingly, instead of rejecting or absorbing any photons as occurs in a conventional color filter array, the grating layer 112a (or cascaded grating layer 112b) is capable of separating the incident light into various spectral components and directing the same to the various photosensors 106a and 106b. For example, the grating layer 112a can be formed to direct the photons of different colors into the red and blue photosensors 106R and 106B. In one example where high-efficiency gratings 112a, 112b are used, the quantum efficiency of each of the grating layers 112a, 112b can reach 100% (i.e., no light is rejected). Comparing to the color detection scheme used in a traditional color filter array, the quantum efficiency of an imager device 10 can be improved by up to 200%.

The imager pixel array 100 and the imager device 10 can be formed by any of various conventional methods as described below with reference to FIGS. 1a and 1b. The steps described herein need not be performed in any particular order, except for those logically requiring the results of prior actions. Accordingly, while the steps below are described as being performed in a general order, the order is exemplary only and can be altered if desired.

In one example, an array of photosensors 106a, 106b are formed in a substrate 104, which may be any of the types of substrates described above. Various interlayer dielectric layers 108 and associated metallization patterns 108a can be formed by any of various conventional methods, which are known in the art. In another example, one or more protective layers 110 can be provided and formed over the array of photosensors 106a, 106b and the substrate 104 to passivate it and to provide a planarized surface. For example, the protective layers 110 can be formed of a phospho-silicate-glass (PSG), silicon nitride, or oxynitride.

The grating layer 112a can be formed by any of various methods. In one example, the grating layer 112a can be formed in the protective layer 110. For example, the protective layer 110 can be patterned and etched to form striped areas for the grating layer 112a, such as by standard lithographic methods. A grating material layer, such as a dispersive material, can be formed over the patterned portion and into the etched portions of the protective layer 110, such as by standard deposition techniques. The grating material layer can be planarized, such as by a chemical/mechanical polishing step to form grating layer 112a. In one example, the grating material layer and the protective layer 110 can be respectively formed of a dispersive material and a less dispersive material, such as those discussed hereinabove.

In another example, the grating layer 112a can be formed on or over the protective layer 110. For example, one of the dispersive grating and less dispersive surrounding material layers may be blanket deposited onto the protective layer 110. The other of the grating and surrounding material layers is then deposited into the etched spaces and then planarized to form the grating layer 112a. In another example, one of the dispersive grating and less dispersive surrounding material layers may be deposited in stripes onto the protective layer 110. The other of the grating and surrounding material layers is then deposited into the spaces of the grating material layer and planarized to form the grating layer 112a. In a further example, the grating layer 112a can be formed by epitaxial growth through masking and growing the grating material and performing chemical/mechanical polishing to form grating layer 112a.

If desired, a spacing layer 116 can be formed over the grating layer 112a. An array of microlenses 114 may then be formed from a lens forming layer. In one example, the microlenses 114 are formed so that each microlens 114 overlies a pixel cell 102. Alternative constructions in which a microlens 114 overlies multiple pixel cells 102 are also encompassed by the invention. Those skilled in the art will appreciate that the imager pixel array 100 and the imager device 10 can be formed in various other ways, which are also within the scope of the invention.

Figure 7:
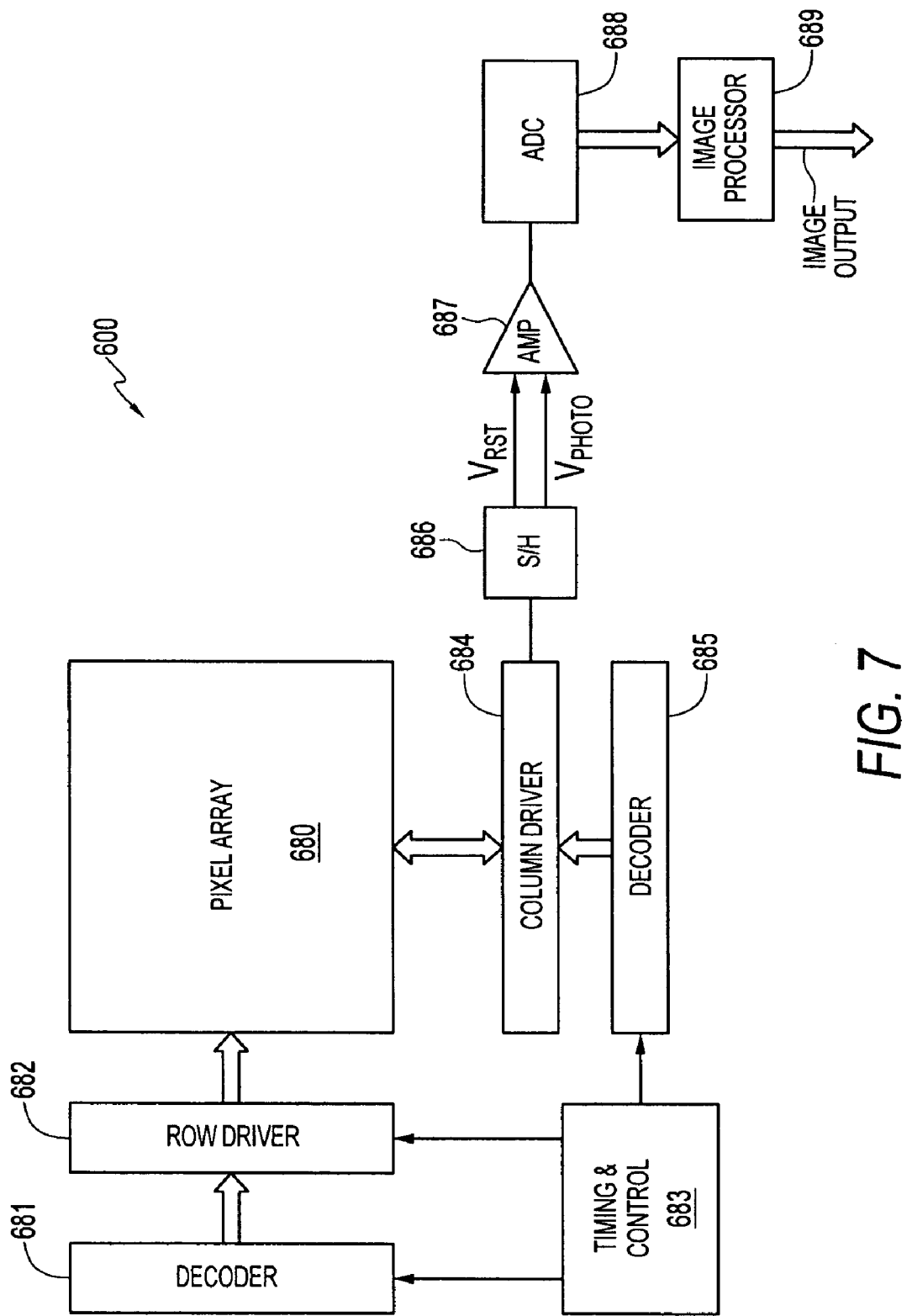

FIG. 7 shows a block diagram of a typical single chip CMOS imager device 600, in which the imager pixel array 680 used is formed in accordance with various embodiments of the invention. The pixel cells 102 (see FIGS. 3a and 3b) of the imager pixel array 680 are arranged in a predetermined number of columns and rows. In one example, each pixel cell 102 is capable of outputting image data representing an image segment detected and sensed by that pixel cell. For example, the image data can be generated based on the red, green, and blue lights in the incident light impinging on that pixel cell 102.

The pixel cells 102 in the imager pixel array 680 are read out row by row. Accordingly, pixels 102 in a row of the imager pixel array 680 are all selected for readout at the same time by a row select line, and each pixel 102 in a selected row provides a signal representative of received light to a readout line for its column. In the imager pixel array 680, each column also has a select line, and the pixels 102 of each column are selectively read out onto output lines in response to the column select lines.

The row select lines in the pixel array 680 are selectively activated by a row driver 682 in response to row address decoder 681. The column select lines are selectively activated by a column driver 684 in response to column address decoder 685. The pixel array 680 is operated by the timing and control circuit 683, which controls address decoders 681, 685 for selecting the appropriate row and column lines for pixel signal readout.

The signals on the column output lines typically include a pixel reset signal ($V_{rst}$) and a pixel image signal ($V_{photo}$) for each pixel 102. Both signals are read into a sample and hold circuit (S/H) 686. A differential signal ($V_{rst}$-$V_{photo}$) is produced by differential amplifier (AMP) 687 for each pixel 102, and each pixel's differential signal is digitized by analog-to-digital converter (ADC) 688. The analog-to-digital converter 688 supplies the digitized pixel signals to an image processor 689, which performs appropriate image processing before providing digital signals defining an image output. In one example, the digitized pixel signals received by the image processor 689 each represent an image segment obtained by each pixel cell 102. The image processor 689 is thus capable of outputting an image without color demosaicing. Those skilled in the art will appreciate that the imager device 600 and other components contained therein can be formed and operate in various other ways, which are also within the scope of the invention.

Figure 8:
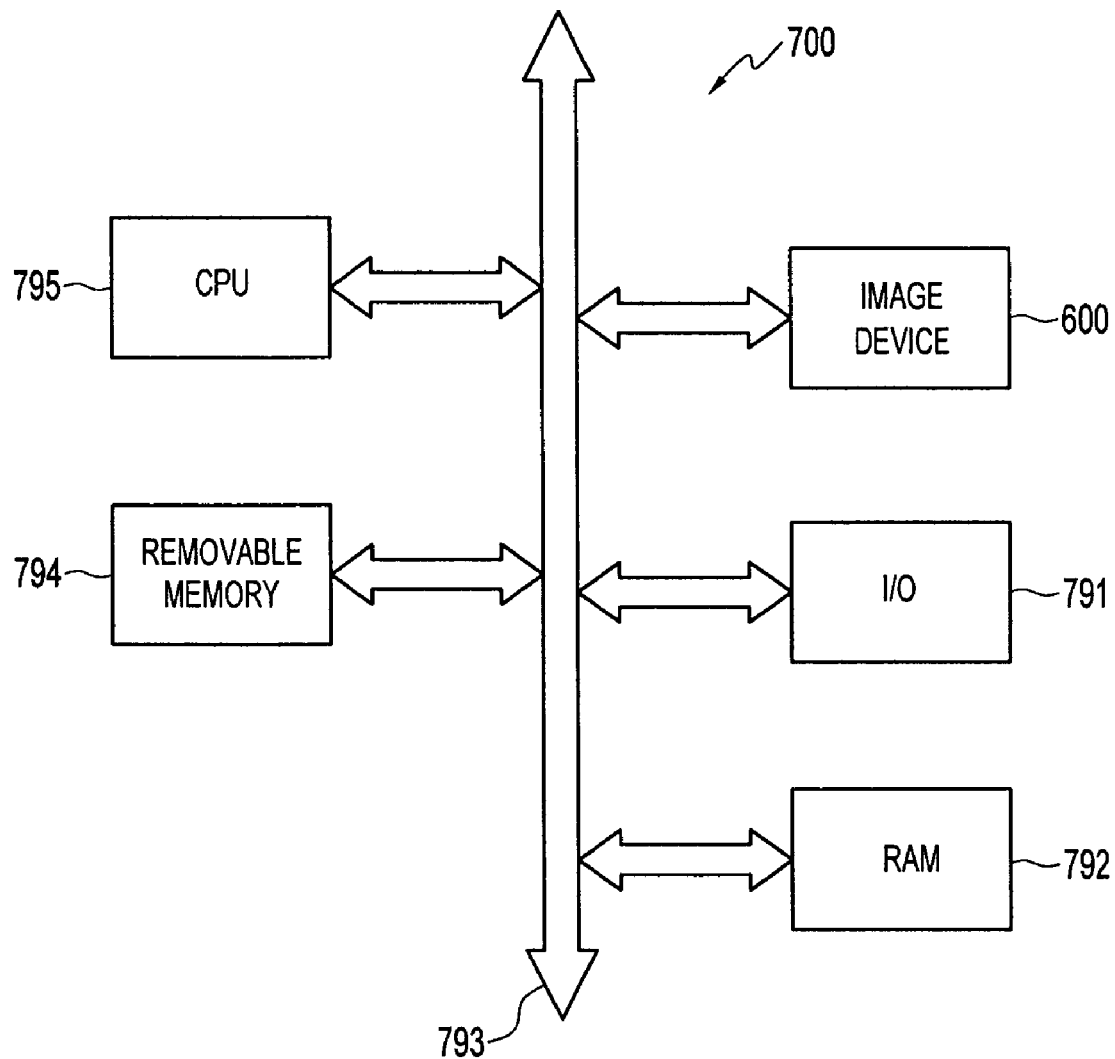
FIG. 8 illustrates an image system comprising the imager device shown in FIG. 7.

FIG. 8 illustrates an imager system 700 including the imager device 600 of FIG. 7. The imager system 700 can be any of various systems having digital circuits that could include imager devices. Without being limiting, such a system could include a computer system, a camera system (such as digital cameras including digital still cameras, digital movie cameras, and digital cameras performing both operations), a scanner, a machine vision, a vehicle navigation, a video phone, a surveillance system, an auto focus system, a star tracker system, a motion detection system, and other systems supporting image acquisition.

The imager system 700 can generally comprise a central processing unit (CPU) 795, such as a microprocessor, that communicates with an input/output (I/O) device 791 over a bus 793. The imager system 700 can also comprise random access memory (RAM) 792, and can include removable memory 794, such as flash memory, which can communicate with CPU 795 over the bus 793.

In one example, the imager system 700 can be a camera system, such as a digital camera. The imager device 600 contained in the digital camera 700 can communicate with the CPU 795 over the bus 793. The CPU 795 is configured to be capable of processing image data received from the imager device 600. In one example, the image data represents an image segment impinging on each pixel 102 (see FIGS. 1a and 1b). The imager device 600 may be combined with a processor, such as a CPU, digital signal processor, or microprocessor, with or without memory storage on a single integrated circuit or on a different chip than the processor. Those skilled in the art will appreciate that the imager system 700 and other components contained therein can be formed and operate in various other ways, which are also within the scope of the invention.

It is again noted that although described is the example described with reference to a CMOS imager, the invention is not limited to CMOS imagers and can be used with other imager technology (e.g., CCD technology) as well.

It will be appreciated that the various features described herein may be used singly or in any combination thereof. Therefore, the invention is not limited to only the embodiments specifically described herein. While the foregoing description and drawings represent examples of the invention, it will be understood that various additions, modifications, and substitutions may be made therein without departing from the spirit and scope of the invention as defined in the accompanying claims. In particular, it will be clear to those skilled in the art that the invention may be embodied in other specific forms, structures, arrangements, proportions, and with other elements, materials, and components, without departing from the spirit or essential characteristics thereof. One skilled in the art will appreciate that the invention may be used with many modifications of structure, arrangement, proportions, materials, and components and otherwise, used in the practice of the invention, which are particularly adapted to specific environments and operative requirements without departing from the principles of the invention. The presently disclosed embodiments are therefore to be considered in all respects as illustrative and not restrictive, the scope of the invention being indicated by the appended claims, and not limited to the foregoing description.

What is claimed as new and desired to be protected by Letters Patent of the United States is:

1. An imager pixel array comprising:
an array of photosensors formed in a substrate; and
a grating layer formed over at least a portion of the array of photosensors and comprising first and second different materials, the first and second materials having substantially the same refractive index at a predetermined wavelength;

wherein the grating layer is capable of separating incident light into a plurality of spectral components which are directed to photosensors of the array.

2. The imager pixel array of claim 1, wherein one of the spectral components is associated with the predetermined wavelength and is transmitted through the grating layer; and wherein another spectral component is diffracted by the grating layer.

3. The imager pixel array of claim 1, wherein the first material is selected from the group consisting of ITO, $TiO_2$, GaN, ZnO, GaAs, GaP, InP, $GaAs_xP_y$, and a silicon-rich dielectric material.

4. The imager pixel array of claim 1, wherein the second material is selected from the group consisting of $Si_3N_4$, $SiN_xO_y$, $SnO_2$, SiC, $Ta_2O_5$, and InP.

5. The imager pixel array of claim 1, wherein the first and second materials are formed of a material pair selected from the group consisting of ITO and $Si_3N_4$, ITO and $SiN_xO_y$, ITO and $SnO_2$, $TiO_2$ and SiC, $TiO_2$ and $Ta_2O_5$, GaN and SiC, GaN and $Ta_2O_5$, ZnO and $Si_3N_4$, ZnO and $SiN_xO_y$, ZnO and $SnO_2$, $GaAs_xP_y$ and InP, and a silicon-rich dielectric material and $SiN_xO_y$.

6. The imager pixel array of claim 1, wherein the first and second materials are respectively ITO and $SiN_xO_y$.

7. The imager pixel array of claim 6, wherein the predetermined wavelength is in the spectrum range of red light.

8. The imager pixel array of claim 6, wherein the predetermined wavelength is in the spectrum range of infrared light.

9. The imager pixel array of claim 1, wherein the first and second materials each having a refractive index which are the same at the predetermined wavelength.

10. The imager pixel array of claim 1, wherein the predetermined wavelength is in the spectrum range of one of red, green, and blue light.

11. The imager pixel array of claim 1, wherein the array of photosensors comprise red, green, and blue photosensors.

12. The imager pixel array of claim 1, wherein the photo sensors comprise:
a plurality of first photosensors receiving a first spectral component transmitted through the grating layer; and
a plurality of second photosensors receiving a second spectral component diffracted by the grating layer.

13. The imager pixel array of claim 12, wherein the first and second photosensors alternate with one another in the array of photosensors.

14. The imager pixel array of claim 12, wherein the first and second photosensors are respectively red and blue photosensors.

15. The imager pixel array of claim 12 further comprising an array of microlenses provided over the array of photo sensors, wherein the microlenses each have a pitch of about twice the pitch of the first photosensors.

16. The imager pixel array of claim 12 further comprising an array of microlenses provided over the array of photo sensors, wherein the micro lenses each have a pitch of about four times that of the second photosensors.

17. The imager pixel array of claim 1 further comprising a cascaded grating layer for separating at least one of the plurality of spectral components into a plurality of spectral sub-components,
wherein the grating layer and the cascade grating layer have different diffraction directions.

18. The imager pixel array of claim 1, wherein the grating layer has a diffraction direction perpendicular to that of the cascaded grating layer.

19. The imager pixel array of claim 17, wherein the cascaded grating layer comprises a sub-wavelength grating.

20. The imager pixel array of claim 1, wherein the grating layer has a period greater than the predetermined wavelength of the spectral components.

21. The imager pixel array of claim 1, wherein the grating layer has a constant grating period P.

22. The imager pixel array of claim 1, wherein the grating layer has a changing grating period P.

23. The imager pixel array of claim 22, wherein the grating period P increases from a center portion to a peripheral portion of the grating layer across substantially the entire image pixel array.

24. The imager pixel array of claim 1, wherein the grating layer has a changing duty cycle in each pixel cell.

25. The imager pixel array of claim 24, wherein the duty cycle decreases gradually from a center portion to a peripheral portion of in each pixel cell.

26. An imager pixel array comprising a plurality of imager pixel cells, each of which comprises:
a microlens;
a grating section formed under the microlens, the grating section comprising first and second different materials, the first and second materials having substantially the same refractive index at a predetermined wavelength; and
a plurality of photosensors formed under the grating section and on or over a substrate;
wherein the grating section separates incident light into a plurality of spectral components which are at least partially directed to different photosensors.

27. The imager pixel array of claim 26, wherein the photosensors in each pixel cell comprise a first photosensor located directly beneath the microlens.

28. The imager pixel array of claim 26, wherein the photosensors in each pixel cell comprise a second photosensor, which is integrally formed with another second photosensor in an adjacent pixel cell.

29. The imager pixel array of claim 26, wherein the photo sensors in each pixel cell comprise:
a first photosensor receiving a first spectral component transmitted through the grating layer; and
at least one second photosensor receiving a second spectral component diffracted by the grating layer.

30. The imager pixel array of claim 29, wherein the first and second photosensors are respectively red and blue photosensors.

31. The imager pixel array of claim 26, wherein the grating layer comprises a grating material being selected from the group consisting of ITO, $TiO_2$, GaN, ZnO, GaAs, GaP, InP, $GaAs_xP_y$, and a silicon-rich dielectric material.

32. The imager pixel array of claim 26, wherein the grating layer comprises a filling material being selected from the group consisting of $Si_3N_4$, $SiN_xO_y$, $SnO_2$, SiC, $Ta_2O_5$, and InP.

33. The imager pixel array of claim 26, wherein the grating layer is formed of a material pair selected from the group consisting of ITO and $Si_3N_4$, ITO and $SiN_xO_y$, ITO and $SnO_2$, $TiO_2$ and SiC, $TiO_2$ and $Ta_2O_5$, GaN and SiC, GaN and $Ta_2O_5$, ZnO and $Si_3N_4$, ZnO and $SiN_xO_y$, ZnO and $SnO_2$, $GaAs_xP_y$ and InP, and a silicon-rich dielectric material and $SiN_xO_y$.

34. The imager pixel array of claim 26, wherein grating layer is formed of ITO and $SiN_xO_y$.

35. The imager pixel array of claim 26, wherein each grating section has a grating period increasing from a center portion to a peripheral portion of the grating section within the pixel cell.

36. The imager pixel array of claim 29, wherein each grating section has a smaller grating period P above the first photosensor and a larger grating period above the second photosensor.

37. The imager pixel array of claim 26 further comprising a cascaded gyrating layer for separating at least one of the plurality spectral components into a plurality of spectral sub-components,
wherein the grating layer and the cascade grating layer have different grating directions.

38. An imager device comprising an imager pixel array and a peripheral circuitry for receiving image data representing an image captured by the imager pixel array, wherein the imager pixel array comprises:
an array of photosensors formed in a substrate; and
a grating structure formed over at least a portion of the array of photosensors and comprising a grating layer, the grating layer being formed of first and second different materials each having a refractive index that are substantially the same at a predetermined wavelength.

39. The imager device of claim 38, wherein the grating structure passes some spectral components to at least one photosensor without diffraction and passes some other spectral components to at least one other photosensor by diffraction.

40. The imager device of claim 38, wherein the grating structure further comprises a cascaded grating layer for separating at least one of the plurality spectral components into a plurality of spectral sub-components, and wherein the grating layer and the cascade grating layer have different grating directions.

41. The imager device of claim 40, wherein the cascaded grating layer comprises a sub-wavelength grating.

42. The imager device of claim 38, wherein the array of photosensors comprise red, green, and blue photosensors.

43. An imager system comprising
an imager pixel array comprising a plurality of pixel cells, each of which comprises:
a plurality of photosensors formed in a substrate;
a grating layer formed over the photosensors for separating spectral components and directing them to different photosensors, the grating layer comprising first and second different materials, the first and second materials having substantially the same refractive index at a predetermined wavelength; and
a microlens formed over the grating layer; and
a processor for processing image data received from the imager pixel array.

44. The imager system of claim 43, wherein the image data represents an image segment impinging on the microlens in the pixel cell.

45. The imager system of claim 43, wherein the image data is generated based on red, green, and blue light detected by the photosensors in each pixel cell.

46. The imager system of claim 43, wherein the plurality of photosensors detect and sense respectively all three primary colors of incident light.

47. The imager system of claim 43, wherein the system comprises a digital camera.

48. A method of forming an imager pixel array, the method comprising:
forming an array of photosensors in a substrate; and
forming a grating layer over at least a portion of the array of photosensors;
wherein the grating layer is formed of first and second different materials, the first material having at least one refractive index that is substantially the same as that of the second material at a predetermined wavelength.

49. The method of claim 48, wherein the step of forming a grating layer comprises:
forming a first material layer over at least a portion of the array of photosensors;
selectively removing portions of the first material layer to form a plurality of first grating segments; and
forming a plurality of second grating segments in the removed portions in the first material layer.

50. The method of claim 49, wherein the first material layer is a protective layer.

51. The method of claim 49, wherein the first and second grating segments are formed of respectively dispersive and less dispersive materials.

52. The method of claim 48, wherein the step of forming a grating layer comprises epitaxially growing a grating material.

53. The method of claim 48 further comprising forming an array of microlenses over the grating layer, wherein each microlenses is formed directly above a plurality of photosensors to form a pixel cell.

54. The method of claim 48, wherein the grating layer comprises a grating material being selected from the group consisting of ITO, $TiO_2$, GaN, ZnO, GaAs, GaP, InP, $GaAs_xP_y$, and a silicon-rich dielectric material.

55. The method of claim 48, wherein the grating layer comprises a filling material being selected from the group consisting of $Si_3N_4$, $SiN_xO_y$, $SnO_2$, SiC, $Ta_2O_5$, and InP.

56. The method of claim 48, wherein the grating layer is formed of a material pair selected from the group consisting of ITO and $Si_3N_4$, ITO and $SiN_xO_y$, ITO and $SnO_2$, $TiO_2$ and SiC, $TiO_2$ and $Ta_2O_5$, GaN and SiC, GaN and $Ta_2O_5$, ZnO and $Si_3N_4$, ZnO and $SiN_xO_y$, ZnO and $SnO_2$, $GaAs_xP_y$ and InP, and a silicon-rich dielectric material and $SiN_xO_y$.

57. The method of claim 48, wherein grating layer is formed of ITO and $SiN_xO_y$.

* * * * *